United States Patent [19]

VanRoessel

[11] Patent Number: 4,518,948
[45] Date of Patent: May 21, 1985

[54] ANALOG-TO-DIGITAL CONVERTER

[75] Inventor: Frederik J. VanRoessel, Upper Saddle River, N.J.

[73] Assignee: U.S. Philips Corporation, New York, N.Y.

[21] Appl. No.: 438,123

[22] Filed: Nov. 1, 1982

[30] Foreign Application Priority Data

Nov. 20, 1981 [NL] Netherlands .................. 8105254

[51] Int. Cl.³ .................. H03K 13/02; H03K 13/20
[52] U.S. Cl. .................. 340/347 NT; 324/99 D; 340/347 AD; 340/347 M
[58] Field of Search .................. 340/347 NT, 347 AD, 340/347 CC; 324/99 D, 78 D, 78 E; 328/150; 332/11 D; 375/28

[56] References Cited
PUBLICATIONS

DeFreitas, The Low-Cost Way to Send Digital Data: Delta-Sigma Modulation, Electronic Design 2 Jan. 1974, pp. 68 & 69.

Primary Examiner—T. J. Sloyan
Attorney, Agent, or Firm—Thomas A. Briody; William J. Streeter

[57] ABSTRACT

An analog-to-digital converter incorporating a series arrangement (3, 4, 5, 6) of an integrating circuit (3), a comparison circuit (4), a flip-flop (5) and a gate (6), a clock pulse signal being applied to the two last-mentioned components. An output of the flip-flop (5) is fed back to the input (14) of the integrating circuit (3) to which also the signal to be converted is applied via a switchable current source circuit (15). For effecting an optimum (ideal) integration resulting in a linear conversion, the integrating circuit (3) has a construction as shown in the drawing, it being essential for the product of the value of the capacitor 9 and the resistor 10 to be substantially equal to the value of the capacitor 12 and the resistor 11. The capacitor values and the resistor values may, for example, be equal.

6 Claims, 2 Drawing Figures

ANALOG-TO-DIGITAL CONVERTER

BACKGROUND OF THE INVENTION

The invention relates to an analog-to-digital converter incorporating a series arrangement between an input and an output terminal of the converter, comprising an integrating circuit, a comparison circuit, a flip-flop and a coincidence gate, a clock pulse input of the flip-flop and an input of the coincidence gate being connected to a clock pulse input terminal of the converter, the converter incorporating, provided in a feedback path, a switchable current source circuit, a current source output terminal of which is connected to an input of the integrating circuit and which is further coupled to the input terminal of the converter, and a current source change-over terminal which is connected to a flip-flop output.

Such an analog-to-digital converter is disclosed in U.S. Pat. No. 4,112,428 in which it is stated that the described structure of the converter incorporating the switchable current source circuit results in a linear conversion of the analog input signal into a pulse train of the clock pulses. The current source circuit comprises a current source which is incorporated in a bridge circuit formed by switches which are controlled by output signals of the flip-flop. The construction of the integrated circuit is not further described and it is only stated that an optimum integration is effected. A linear conversion is only obtained when such an assumption is accepted.

SUMMARY OF THE INVENTION

The invention has for its object to realize an analog-to-digital converter with which a linear conversion is achieved in an optimum manner. According to the invention, an embodiment of an analog-to-digital converter is characterized in that a first input of a differential amplifier incorporated in the integrating circuit is connected to the current source output terminal and to an amplifier output via a series arrangement comprising a first capacitor and a first resistor, a second input being coupled and the output of this differential amplifier being coupled, via a series arrangement of a second resistor and a second capacitor, to a terminal carrying a reference voltage, the junction between the second resistor and the second capacitor forming the output of the integrating circuit and the product of the values of the first capacitor and the first resistor being substantially equal to the product of the values of the second capacitor and the second resistor.

The invention is based on the recognition that with the described structure of the integrating circuit the choice of the substantially equal time constants of the first and second capacitors and resistors results in an optimum integration.

The optimum integration can be obtained with the lowest possible number of components having different values in a converter which is further characterized in that the values of the first capacitor and the first resistor are substantially equal to the value of the second capacitor and the second resistor, respectively.

For an optimum operation of the analog-to-digital converter in accordance with the invention it is a requirement that the current source circuit applies accurately dosed current surges to the integrating circuit in the series arrangement. To that end, a simple embodiment of the converter in accordance with the invention is characterized in that in the current source circuit, the current source change-over terminal is coupled to an output of a current source incorporated in the circuit via at least one diode, and the current source output terminal is coupled to the output of the current source via at least two diodes, which are arranged in series and in the same forward direction as the previously mentioned diode.

In order to obtain a converter which is operative in the linear mode, when change-over of the current source circuit occurs at high frequency, an embodiment of the converter in accordance with the invention is characterized in that the output of the current source is coupled to the diodes via a series arrangement incorporating a coil and a resistor.

DESCRIPTION OF THE DRAWINGS

The invention will now be further described by way of example with reference to the accompanying drawing, in which.

DESCRIPTION OF THE PREFERRED EMBODIMENTS

Figure 1:
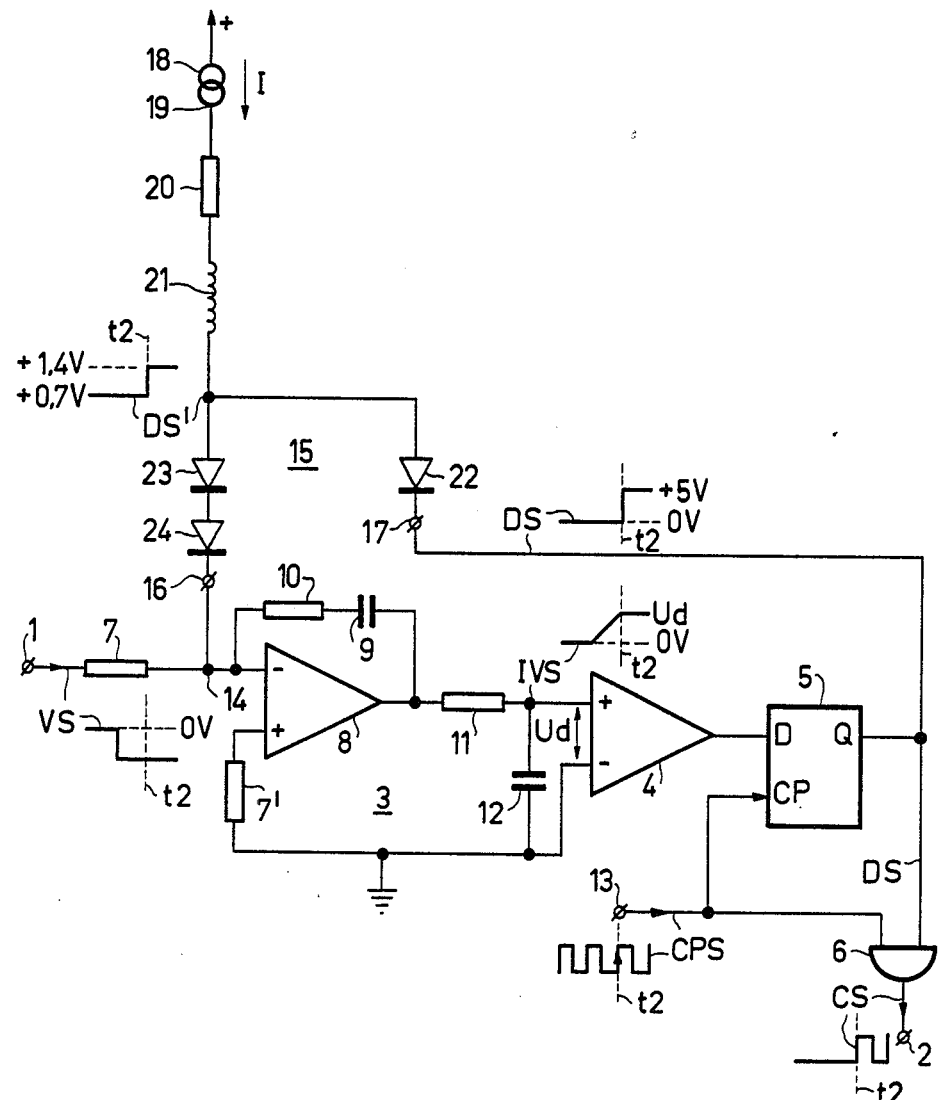
FIG. 1 shows an embodiment of an analog-to-digital converter in accordance with the invention.
Figure 2:
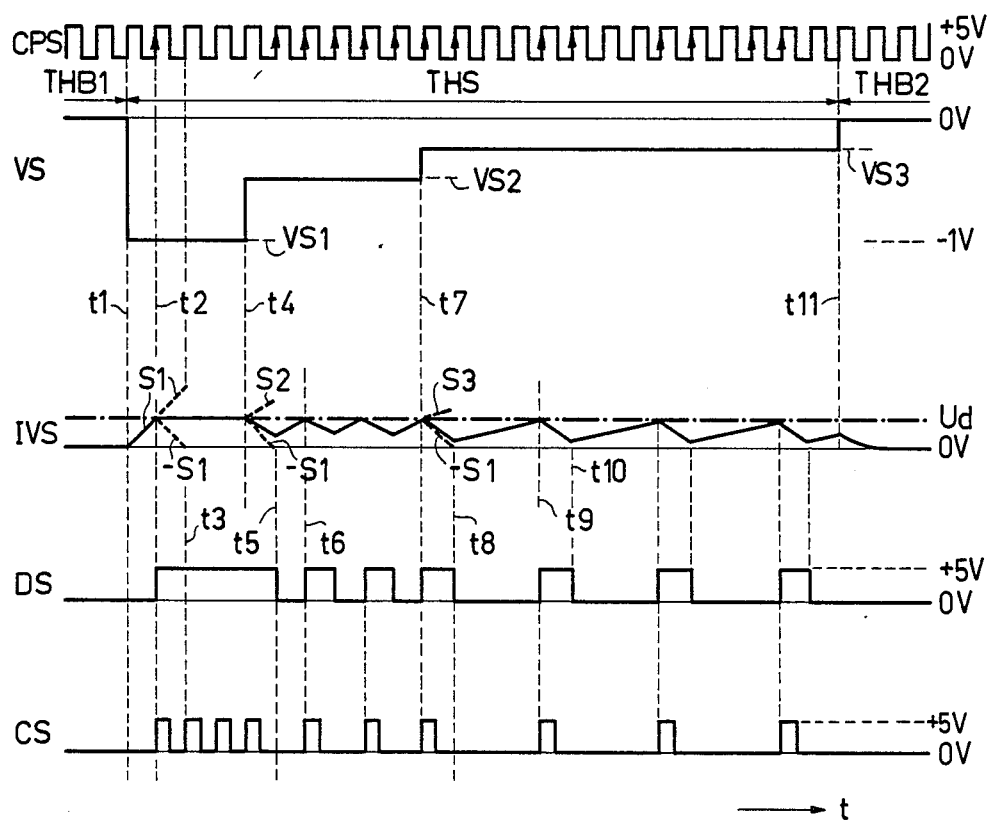
FIG. 2 shows some voltage variations as a function of the time of signals shown in FIG. 1.

An input terminal of the analog-to-digital converter shown in FIG. 1 is denoted by reference numeral 1 and an output terminal by reference numeral 2. At the input terminal 1 it is shown that a signal VS is applied thereto. The signal VS is, for example, a video signal of the type used in television. In FIG. 2 a voltage variation of the signal VS (and of other signals still further to be described) is plotted versus the time t. For simplicity of the description of the operation of the converter shown in FIG. 1, the voltage variation of the video signal VS of FIG. 2 is shown with three constant values VS1, VS2 and VS3. This voltage variation is, for example, present in a television line scanning period THS. The preceding and next television line blanking period, respectively is (shown partly) indicated by THB1 and THB2, respectively. During the line blanking period (THB) the ground potential equal to 0 V, is present as a reference voltage in the video signal VS, which is obtained by means of a clamping circuit, not shown, preceding the terminal 1. Together with the line scanning period THS, the preceding or the next line blanking period (THB) forms a television line period. All this is laid down in, for example, television standards. Normally, the video signal VS has a continuously changing variation over the line scanning period THS, depending on the content of a recorded scene.

A signal CS is shown at the output terminal 2 of the converter of FIG. 1. The signal CS shown in FIG. 2 comprises a pulse train having a number of pulses in the line scanning period THS which correspond to the average voltage value of the video signal VS.

A series arrangement (3, 4, 5, 6), comprising an integrating circuit 3, a comparison circuit (4) in the form of a differential amplifier 4, a flip-flop 5 of the D-type and a coincidence gate 6 which is shown as an AND-gate, is included between the input and output terminals 1 and 2 of the analog-to-digital converter of FIG. 1. The input terminal 1 is connected via a resistor 7 to a (−) input of a differential amplifier 8 incorporated in the integrating circuit 3. A (+) input of the amplifier 8 is connected to ground via a resistor 7′. The resistor 7′ is used, in known manner, for off-set at the amplifier 8 and is, for example, substantially equal to the resistor 7 or is absent. An output of the amplifier 8 is connected to the (−) input thereof via a series arrangement (9, 10) comprising a capacitor 9 and a resistor 10. The positions of the capacitor 9 and the resistor 10 may be interchanged. The output of the amplifier 8 is connected via a resistor 11 to a (+) input of the differential amplifier 4, the (+) input being connected via a capacitor 12 to ground. A (−) input of the differential amplifier 4 is connected to ground; to compensate for the resistor 11, a substantially equal resistor may be included in this connection. For the connections to ground it holds that they correspond to connections to a terminal carrying a reference voltage, the reference voltage being equal to the ground potential.

It is essential for the integrating circuit 3 that the product of the values of the capacitor 9 and the resistor 10 be substantially equal to the product of the values of capacitor 12 and resistor 11. That this relationship is essential will be evident after the description how the analog-to-digital converter shown in FIG. 1 operates.

The (+) input of the differential amplifier 4 is connected to the output of the integrating circuit 3, this output being formed by the junction between the resistor 11 and the capacitor 12, and is supplied with a signal IVS, the voltage variation of which is shown in FIG. 2. A voltage value Ud, which is further shown next to the signal IVS of FIG. 2, is shown at the differential amplifier 4 between the (+) input and the (−) input (having ground potential). A voltage value in the signal IVS below the voltage value Ud results in a low output voltage of the amplifier 4 and a value equal to or higher than the value Ud results in a high amplifier output voltage.

The output of the amplifier 4 is connected to a D-input of the flip-flop 5 which is of the D-type. The D-type is mentioned as an example only and different types are possible for the flip-flop 5. The flip-flop 5 has a clock pulse input CP which is connected to a clock pulse input terminal 13 of the converter of FIG. 1. Pulses of a clock pulse signal CPS which will be described further in FIG. 2 are shown next to the terminal 13. By way of example, a clock pulse frequency of approximately 5 MHz may be used. A Q-output of the flip-flop 5 is connected to an input of the gate 6. The Q-output supplies a signal DS, the voltage variation of which is further shown in FIG. 2. A further input of the gate 6 is connected to clock pulse input terminal 13 and the output thereof is connected to the terminal 2 for supplying the signal CS.

The Q-output of the D-flip-flop 5 is fed back into the series arrangement (3, 4, 5, 6), more specifically, to the input of the integrating circuit 3, which corresponds to a connection point, denoted by 14, between the resistor 7 and the (−) input of the amplifier 8. In the converter shown in FIG. 1 a switchable current source circuit 15 is provided between the Q-output of the flip-flop 5 and the (input) connection point 14. A current source output terminal 16 of the current source circuit 15 is connected to the (input) connecting point 14 and a current source change-over terminal 17 is connected to the Q-output of the flip-flop 5. Thus, a feedback path (17, 15 and 16) is incorporated in the converter shown in FIG. 1. In the current source circuit 15, reference numeral 18 denotes a current source which supplies a constant current I at an output 19 thereof. The specific construction of the current source 18 is not further described, a "+" sign with which the direction of the constant current I is associated, is shown next to a supply terminal on the current source 18.

The output 19 of the current source 18 is connected to a series arrangement (20, 21) comprising a resistor 20 and a coil 21. The terminal of the coil 21 remote from the resistor 20 is connected to the terminal 17 via a diode 22 and to the terminal 16 via two series-arranged diodes 23 and 24. The cathodes of the diode 22 and 24, respectively are connected to the terminal 17 and 16, respectively.

To explain the operation of the converter shown in FIG. 1, the following holds, the situation in which no current is taken from the terminal 16 being the starting point. In addition, the ground potential of 0 V is present in the signals VS, IVS, DS and CS (FIG. 2).

A possible voltage variation of the video signal VS is shown schematically in FIG. 2. Let it be assumed that at an instant t1 at the beginning of the line scanning period THS, a voltage step from 0 V to −1 V=VS1 is produced in the signal VS. In the example given, this step of 1 V is the peak-peak value of the video signal VS. The negative voltage values VS1 results in a positive voltage at the output of the amplifier 8, the integrating circuit 3 producing in the signal IVS a voltage increase, the slope of which is denoted in FIG. 2 by S1. Let it also be assumed that just prior to or at an instant t2, the voltage in the signal IVS has attained the value Ud. In this situation, the output of the amplifier 4 carries the high voltage value. At the instant t2, an ascending pulse edge of, for example, 0 V to +5 V, occurs in the clock pulse signal CPS. This ascending pulse edge which operates as a triggering edge (arrow tip) at the flip-flop 5 causes the Q-output to take over the high value present on the D-input; the flip-flop 5 changes state, as is shown at the signal DS. Further clock pulse edges which act as triggering edges and cause the flip-flop 5 to change state have also been provided with arrow tips in FIG. 2. The high value of, for example, +5 V occurring at the Q-output at the instant t2, enables the gate 6, so that this gate transmits at the instant t2 the clock pulse applied to it, as can be seen from the shown signal CS.

In addition, the pulse occurring from the instant t2 in the signal CS causes the diode 22 to be cutoff. Prior to the instant t2, the diode 22 was conductive and carried the current I, in which situation, starting from a diode voltage drop equal to 0.7 V, this voltage was present on the anode. As mentioned in the foregoing, the diodes 23 and 24 were non-conducting as they needed a voltage of at least +1.4 V in order to be capable of conduction. Cutting-off the diode 22 at the instant t2 results in that the diodes 23 and 24 can indeed be made conductive, the voltage equal to +1.4 V then being present on the anode of the diode 23 as shown in FIG. 1 by means of the signal DS′.

The result is that from the instant t2, the constant current I flows from the terminal 16. Let it be assumed that this current I which would produce a voltage decrease in the signal IVS, would produce a slope in the voltage decrease which is shown (by means of a dotted line) by −S1 in this signal. The negative voltage value VS1 is then still present, which would result in a voltage increase having the slope S1 (shown by means of a dotted line). This results in the voltage drop compensating for the voltage increase, so that from the instant t2, the voltage value (Ud) of the signal IVS does not change.

At an instant t3 an ascending pulse edge is again produced in the clock pulse signal CPS. At this instant t3 the voltage at the output of the amplifier 4 still has the high value which is also present on the Q-output of the flip-flop 5, so that this flip-flop does not change state. Everything occurring in this description after the instant t2 also holds for after the instant t3. This results in the gate 6 remaining in the enabled state via the signal DS and the current 15 source circuit supplying the current I unchanged to the terminal 16.

In the video signal VS of FIG. 2 it is shown that at an instant t4 the voltage value VS1 decreases to half its value (VS2). Also the slope of the voltage increase is reduced to half the original value, as is shown by the slope S2 (by means of a dotted line) at the signal IVS. The slope −S1 of the voltage decrease remains present without any change, so that the voltage of the signal IVS decreases after the instant t4.

At a next instant t5 an ascending pulse edge is produced in the clock pulse signal CPS, the voltage value in the signal IVS being at this instant half the value between the instants t2 and t4 and being located below the voltage value Ud. The output voltage of the amplifier 4 is low, so that the Q-output of the flip-flop 5 changes from the high value to the low value, which is shown in the signal DS of FIG. 2. Then, the gate 6 is blocked from the instant t5, so that no clock pulse is produced in the signal CS. In addition, from the instant t5, the current source circuit 15 is in the change-over state, no current I flowing any longer from the terminal 16. This results in only the signal VS having the voltage value VS2 affecting the voltage in the signal IVS. The voltage increase will then have the slope S2.

At an instant t6, the voltage value Ud occurs again in the signal IVS, at which instant there further occurs an ascending clock pulse edge. The Q-output of the flip-flop 5 will then have to take-over the high value present on the D-input, so that this flip-flop changes state. At the instant t6 the gate 6 is opened and the current I starts flowing again from the terminal 16. After the instant t6 the converter operates in the same manner as after the instant t4.

In the video signal VS of FIG. 2, it is shown that at an instant t7 the voltage value VS2 decreases once more by half the value to the value VS3. This is accompanied by a voltage increase having the slope S3 (dotted line) in the signal IVS. The slope S3 has a steepness which, in the absolute sense, is equal to one-fourth of the slope −S1. At an instant t8 (the next ascending clock pulse edge), the signal IVS has a voltage value which is equal to one-fourth of the voltage value between the instants t2 and t4. At the instant t8 the flip-flop 5 has changed to the low value, so that no clock pulses are transmitted via the gate 6 and the current source circuit 15 does not supply current via the terminal 16.

From the instant t8 the voltage in the signal IVS increases until at an instant t9 the voltage value Ud is attained and an ascending clock pulse edge is produced. The flip-flop 5 changes state and the situation described as occurring from the instant t7 onwards, occurs again and continues until an instant t10 which corresponds to the instant t8.

During the presence of the voltage value VS3 in the video signal VS, the same procedure occurring between the instants t7 and t9 is repeated. At an instant t11, the line blanking period THB2 starts, 0 V being present in the video signal VS. From the instant t11, the residual voltage in the signal IVS of FIG. 2 decreases to 0 V.

From FIG. 2 it can be seen, more particularly from the signals VS and CS, that the maximum voltage value VS1 corresponds to a pulse train having the clock pulse frequency, that half the value VS2 corresponds to a pulse train of half the clock pulse frequency and that the one-fourth value VS3 corresponds to a pulse train of one-fourth the clock pulse frequency. So the analog-to-digital converter shown in FIG. 1 operates in the linear mode. The pulse train in the signal CS considered over the line scanning period THS then corresponds to (substantially) the average value of the voltage of the video signal VS.

In the preceding it was assumed, for the sake of simplicity, that reaching the voltage value Ud coincides with the occurrence of one of the ascending clock pulse edges. It will be obvious that in practice this value may be slightly exceeded until the occurrence of the next ascending clock pulse edge.

The signal DS of FIG. 2 not only represents the voltage at the Q-output of the flip-flop 5, but, on an ampere-scale, may also serve as an illustration for the current I such as this current flows via the terminal 16. The current I flows from the terminal 16 in accurately dosed current surges. The embodiment of the current source circuit 15 shown in FIG. 1 and incorporated in the feedback path (11, 15, 16) ensures this accurate dosing. In this situation the current source change-over terminal 17 also acts as a second current source output terminal; the constant current I must flow either from the terminal 16 or from the terminal 17. It is then a requirement that the terminal 16 be coupled via at least one additional diode (23 or 24), relative to the terminal 17, to the output 19 of the current source 18. Compared with other possible embodiments of the current source circuit 15 having a separate change-over terminal and two switchable output terminals, the described embodiment has the advantage that it is simple and accurate. In addition, the current source 18 may produce the constant current I with different adjustable values. In this way the desired slope −S1 (shown by means of a dotted line at the signal IVS of FIG. 2) may optionally be adjusted to a maximum voltage change.

A value of 5 MHz was mentioned by way of example for the clock pulse frequency. From the signal DS shown in FIG. 2, it can be seen that the switchable current source circuit 15 can then have a maximum change-over frequency of 2.5 mHz (between the instants t5 and t8). In order to achieve that, also at this maximum change-over frequency, a sufficient accurate dosing of the current surges via the terminal 16 is present, the coil 21 is arranged in series with the resistor 20. The higher impedance thus obtained at higher change-over frequencies maintains the linearity of the converter with the accurate current dosing via the feedback path (17, 15, 16). The resistor 20 then functions as a damping resistor.

For the linearity of the change-over, not only is the current source circuit 15 important in view of the accurate current dosing, but also the construction of the integrating circuit 3. Namely, the circuit 3 must result in an (ideal) optimum integration of the current applied to the (input) connecting point 14. The construction shown in FIG. 1 satisfies this requirement at a predetermined rating of the values of the resistors and the capacitors, as can be demonstrated by the following calculation.

Let it be assumed that the gain factor and the input impedance of the amplifier 8 are very high and that a current −i is applied to the circuit 3 via the (input) connecting point 14. For the resistors 10 and 11 it holds that they have a value R10 and R11 and for capacitors 9 and 12 it holds that they have the values C9 and C12. The radial frequency is denoted by w. For the output voltage (8) of the amplifier 8 it holds that:

$$V8 = i \cdot \left( R10 + \frac{1}{jwC9} \right) \quad (1)$$

The voltage distribution across the resistor 11 and capacitor 12 results for the voltage of the signal IVS in that:

$$\text{Voltage } (IVS) = \frac{\frac{1}{jwC12}}{R11 + \frac{1}{jwC12}} \cdot V8 \quad (2)$$

If it now holds that $$R10 = R11 \text{ and } C9 = C12 \quad (3)$$

$$\text{Voltage } (IVS) = i \cdot \frac{1}{jwC12} \quad (4)$$

The relation (4) indicates an (ideal) optimum integration. From the relations (1) and (2) it can be derived that:

$$\text{Voltage } (IVS) = i \cdot \frac{1}{jwC9} \cdot \frac{1 + jwR10C9}{jwR11C12} \quad (5)$$

If it now holds that:

$$R10C9 = R11C12 \quad (6)$$

it follows from the relation (5) and (6) that $$\text{Voltage } (IVS) = i \cdot \frac{1}{jwC9} \quad (7)$$

Also the relation (7) indicates an (ideal) optimum integration.

It has been found that an optimum integration can be obtained when the time constants R10C9 and R11C12 are chosen to be equal or moreover when it holds for the resistor values that R10=R11 and for the capacitor values that C9=C12. The last-mentioned solution is the simplest solution when the lowest possible number of components with different values are used. When unequal values are chosen, a desired gain factor can be obtained by a suitable choice of the value R10 and a desired output impedance can be obtained by the choice of the value R11, it then being necessary to match the values C9 and C12.

For an analog-to-digital converter which adequately operates in practice, the signal VS being the described video signal, it holds that R10=R11=464 Ohm and C9=C12=3.9 nF. Furthermore, by way of example, for the current source circuit 15, a current I is used which may be optionally adjusted to 0.3 or 1.4 mA, the inductance of the coil 21 being equal to 330 μH and the resistor 20 having a value of 562 ohm. The resistor 7 has, for example, a value of 1000 ohm, which for example also holds for the resistor 7' when the signal VS is produced by a more or less ideal voltage source.

What is claimed is:

1. An analog-to-digital converter incorporating a series arrangement between an input and an output terminal of the converter, comprising an integrating circuit, a comparison circuit, a flip-flop and a coincidence gate, a clock pulse input of the flip-flop and an input of the coincidence gate being connected to a clock pulse input terminal of the converter, the converter incorporating, provided in a feedback path, a switchable current source circuit, a current output terminal of which is connected to an input of the integrating circuit and which is further coupled to the input terminal of the converter, and a current source change-over terminal which is connected to an output of said flip-flop, characterized in that a first input of a differential amplifier incorporated in the integrating circuit is connected to the current source output terminal and to an amplifier output thereof via a series arrangement comprising a first capacitor and a first resistor, a second input being coupled to a terminal carrying a reference voltage and said output of this differential amplifier being coupled, via a series arrangement of a second resistor and a second capacitor, to said terminal carrying a reference voltage, the junction between the second resistor and the second capacitor forming the output of the integrating circuit, and the product of the values of the first capacitor and the first resistor being substantially equal to the product of the values of the second capacitor and the second resistor.

2. An analog-to-digital converter as claimed in claim 1, characterized in that the values of the first capacitor and the first resistor are substantially equal to the values of the second capacitor and the second resistor, respectively.

3. An analog-to-digital converter as claimed in claim 1, characterized in that in the current source circuit, the current source change-over terminal is coupled to an output of a current source, incorporated in the circuit, via at least one diode, and the current source output terminal is coupled to the output of the current source via at least two diodes which are arranged in series and in the same forward direction as the previously mentioned diode.

4. An analog-to-digital converter as claimed in claim 3, characterized in that the output of the current source is coupled to said diodes via a series arrangement comprising a coil and a resistor.

5. An analog-to-digital converter as claimed in claim 2, characterized in that in the current source circuit, the current source change-over terminal is coupled to an output of a current source, incorporated in the circuit, via at least one diode, and the current source output terminal is coupled to the outpt of the current source via at least two diodes which are arranged in series and in the same forward direction as the previously mentioned diode.

6. An analog-to-digital converter as claimed in claim 5, characterized in that the output of the current source is coupled to said diodes via a series arrangement comprising a coil and a resistor.

* * * * *